United States Patent

Tuen et al.

(10) Patent No.: US 8,816,693 B2
(45) Date of Patent: Aug. 26, 2014

(54) ELECTROSTATIC DISCHARGE TEST METHOD AND TEST SYSTEM

(75) Inventors: Lung-Fai Tuen, New Taipei (TW); Chiu-Hsien Chang, New Taipei (TW)

(73) Assignee: Wistron Corp., New Taipei (TW)

( * ) Notice: Subject to any disclaimer, the term of this patent is extended or adjusted under 35 U.S.C. 154(b) by 240 days.

(21) Appl. No.: 13/536,706

(22) Filed: Jun. 28, 2012

(65) Prior Publication Data

US 2013/0300427 A1      Nov. 14, 2013

(30) Foreign Application Priority Data

May 8, 2012  (TW) .............................. 101116311 A

(51) Int. Cl.
    *G01N 27/60*   (2006.01)
(52) U.S. Cl.
    USPC ........................................ 324/452; 324/458
(58) Field of Classification Search
    USPC ................... 324/452–458, 755.01, 754, 756
    See application file for complete search history.

(56) References Cited

U.S. PATENT DOCUMENTS

| | | | | |
|---|---|---|---|---|
| 5,132,612 A | * | 7/1992 | Burns et al. | 324/750.25 |
| 5,663,655 A | * | 9/1997 | Johnston et al. | 324/750.25 |
| 6,613,650 B1 | * | 9/2003 | Holmberg | 438/438 |
| 7,902,831 B2 | * | 3/2011 | Top et al. | 324/456 |

FOREIGN PATENT DOCUMENTS

| CN | 101689242 A | 3/2010 | |
|---|---|---|---|
| JP | 2001-194404 | 7/2001 | |
| JP | 2001194404 | * 7/2001 | G01R 31/00 |

OTHER PUBLICATIONS

Taiwan Patent Office, Office Action, Patent Application Serial No. 101116311, Dec. 20, 2013, Taiwan.

* cited by examiner

*Primary Examiner* — Arleen M Vazquez
*Assistant Examiner* — Neel Shah

(57) ABSTRACT

An ESD test method for testing an object is disclosed. The object is activated and controlled to separate from a horizontal plane by a pre-determined distance. A first discharge voltage is provided to an external metal portion of the object. A first error is determined to have or have not occurred during the operation of the object each time after the first discharge voltage is provided to the external metal portion. The object is processed to eliminate the first error and then the first discharge voltage is provided to the external metal portion when the first error occurs during the operation of the object. The first error is induced by a hardware structure of the object. The object is moved to contact with the horizontal plane and a specific action is executed when the first error has not occurred during the operation of the object.

17 Claims, 7 Drawing Sheets

ELECTROSTATIC DISCHARGE TEST METHOD AND TEST SYSTEM

CROSS REFERENCE TO RELATED APPLICATIONS

This Application claims priority of Taiwan Patent Application No. 101116311, filed on May 8, 2012, the entirety of which is incorporated by reference herein.

BACKGROUND OF THE INVENTION

1. Field of the Invention

The invention relates to a test method, and more particularly to an electrostatic discharge (ESD) test method.

2. Description of the Related Art

When electrostatic provided by a human body enters an electronic product, if the electronic product is connected to ground, a current is generated and discharged to ground. The discharge state can be simulated by an electrostatic discharge (ESD) test. A change of the electric field induces an error during the operation of the electronic product. Furthermore, the electronic product may absorb energy of the discharge current to damager other apparatuses. Thus, the ESD test is important for the electronic product.

However, during the ESD test, if an error occurs during the operation of the electronic product, the error is induced by an environment coupling effect or a hardware structure, such as cases, electronic elements or tracks. Since the error is induced by a root cause and the root cause cannot be immediately found, a tester consumes a lot time to find the root cause.

BRIEF SUMMARY OF THE INVENTION

An electrostatic discharge (ESD) test method is provided. An exemplary embodiment of an ESD test method for testing an object is described in the following. The object is activated and controlled to separate from a horizontal plane by a pre-determined distance. A first discharge voltage is provided to an external metal portion of the object. A first error is determined to have or have not occurred during an operation of the object each time after the first discharge voltage is provided to the external metal portion. The object is processed to eliminate the first error and then the first discharge voltage is provided to the external metal portion when the first error during the operation of the object occurs. The first error is induced by a hardware structure of the object. The object is moved to contact with the horizontal plane and a specific action is executed when the first error has not occurred during the operation of the object.

In accordance with a further embodiment, a test system comprises a horizontal plane, an object, a carrier and an ESD gun. The object to be tested comprises at least one external metal portion. The carrier moves the object. The ESD gun generates a first discharge voltage. In a first operation mode, the object is separated from the horizontal plane by a pre-determined distance. The external metal portion receives the first discharge voltage. When a first error has not occurred during operation of the object, a second operation mode is activated. In the second operation mode, the carrier moves the object to contact with the horizontal plane.

A detailed description is given in the following embodiments with reference to the accompanying drawings.

BRIEF DESCRIPTION OF THE DRAWINGS

The invention can be more fully understood by referring to the following detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1A:
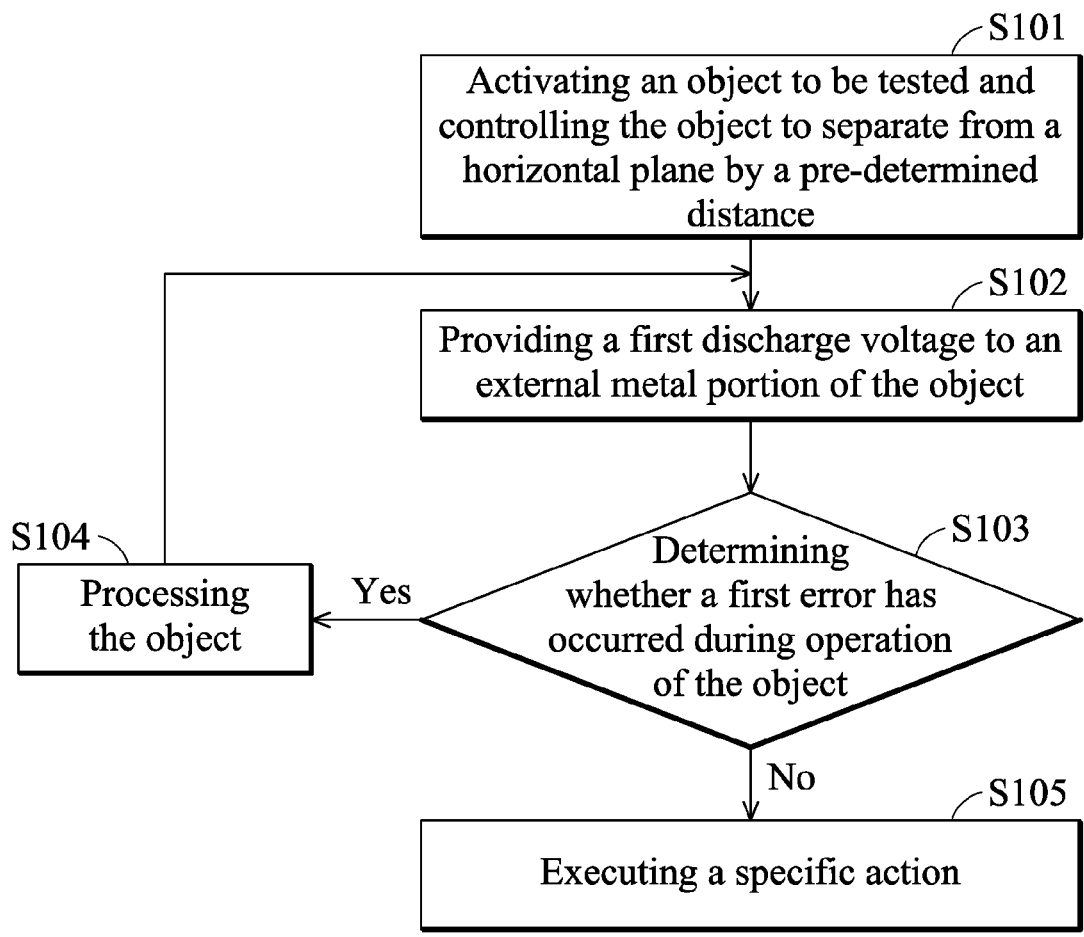
FIG. 1A is a schematic diagram of an exemplary embodiment of an ESD test method.
Figure 1B:
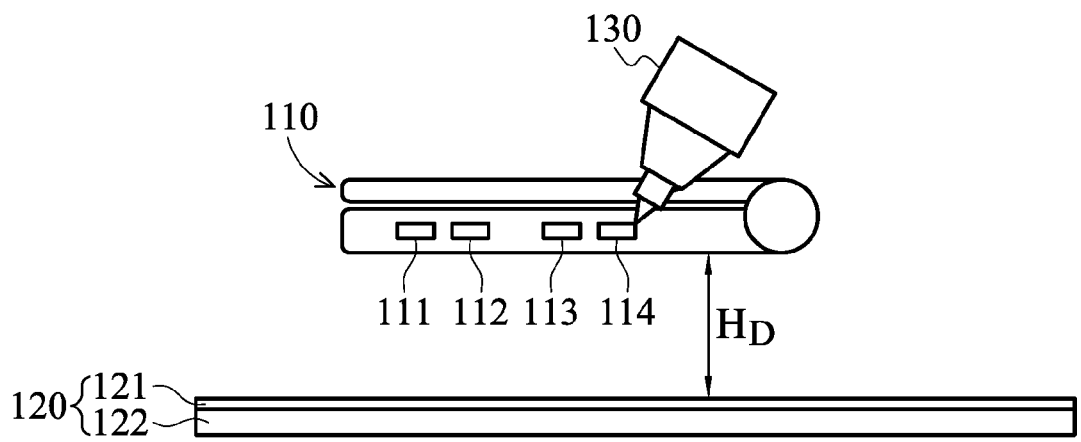
FIG. 1B is a schematic diagram of an exemplary embodiment of a test system operated in a first operation mode.

FIG. 1A is a schematic diagram of an exemplary embodiment of an ESD test method. FIG. 1B is a schematic diagram of an exemplary embodiment of a test system operated in a first operation mode. An object to be tested is activated and controlled to separate from a horizontal plane by a pre-determined distance (step S101). As shown in FIG. 1B, the object 110 is separated from a horizontal plane 120 by the pre-determined distance $H_D$.

The invention does not limit how the object is separated from the horizontal plane by the pre-determined distance. In one embodiment, an isolation object is utilized to set up the object such that the object 110 is separated from the horizontal plane 120 by the pre-determined distance $H_D$. The isolation object may be an acrylic plate or a wooden plate.

In one embodiment, the horizontal plane 120 comprises an isolation layer 121 and a metal layer 122. The isolation layer 121 is disposed between the metal layer 122 and the object 110. In another embodiment, a power supply is utilized to provide power such that the object 110 is activated. Additionally, an ESD current in the object 110 can be released to group via the power supply.

A first discharge voltage is provided to an external metal portion of the object (step S102). As shown in FIG. 1B, in this embodiment, an ESD gun 130 is utilized to contact with the external metal portions 111~114 of the object 110 to provide the discharge voltage. The invention does not limit the kinds of the external metal portions 111~114. In one embodiment, one of the external metal portions 111~114 is an input output port, such as a USB port, a VGA port, a HDMI port, a RJ45 and so on. In other embodiments, one of the external metal portions is an ornament.

Furthermore, the invention does not limit the length of the pre-determined distance $H_D$. In this embodiment, the length of the pre-determined distance $H_D$ relates to the intensity of the first discharge voltage. For example, when the intensity of the first discharge voltage is about 4 KV, the length of the pre-determined distance $H_D$ may be 50 cm, but the disclosure is not limited thereto. In other embodiment, the length of the pre-determined distance $H_D$ may be longer or shorter than 50 cm.

Each time after the first discharge voltage is provided to the external metal portion, a first error is determined to have or have not occurred during operation of the object (step S103). Theoretically, if a hardware structure of the object is normal, when a discharge voltage is provided to the external metal portion of the object, no error occurs during the operation of the object. Thus, the operation of the object is normal.

However, if the hardware structure of the object is abnormal, when the discharge voltage is provided to the external metal portion of the object, an error occurs during the operation of the object. The abnormal hardware structure comprises a screw or a case being too tight, an area to be turned on not being turned on or a sputtering resistance being too high. Thus, it can be confirmed whether the hardware structure of the object is normal according to a determined result. The determined result is to determine whether an error has occurred during the operation of the object after the discharge voltage is provided. Additionally, since the object is separated from the horizontal plane by the pre-determined distance, the object is not interfered with by a response of an electric field induced by the horizontal plane.

When the first error occurs during the operation of the object, the object is processed to eliminate an issue induced by the hardware structure of the object (step S104). After eliminating the error, the first discharge voltage is provided to the external metal portion again (step S102) until no error occurs during the operation of the object. In one embodiment, a tester checks the hardware structure of the object to find the issue induced by the hardware structure. In other embodiments, a test apparatus is utilized to find and eliminate the issue. After eliminating the issue, the first discharge voltage is provided to the external metal portion again and then it is determined whether another error has occurred in the object during the operation of the object.

When no error occurs during the operation of the object, the object is moved to contact with the horizontal plane and a specific action is executed (step S105). The invention does not limit the kind of the specific action. In one embodiment, the specific action is to execute an ESD test conforming to various specifications, such as those of the European Union or America.

In this embodiment, before executing the specific action, the object is controlled to separate from the horizontal plane by the pre-determined distance for confirming whether the error has been induced by the hardware structure of the object. After eliminating the error during the operation of the object, the object is moved to contact with the horizontal plane and then a specific action is executed for measuring a coupling effect of the object such that the object conforms to a corresponding ESD rule established by a specific nation.

Figure 2A:
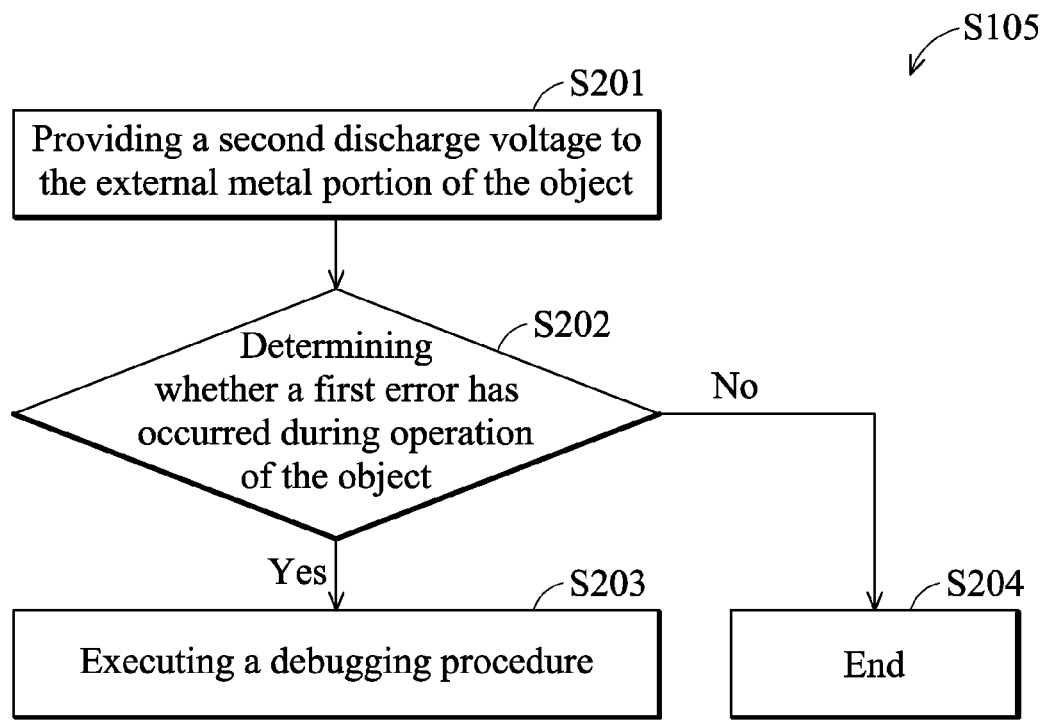
FIG. 2A is a schematic diagram of an exemplary embodiment of a specific action.
Figure 2B:
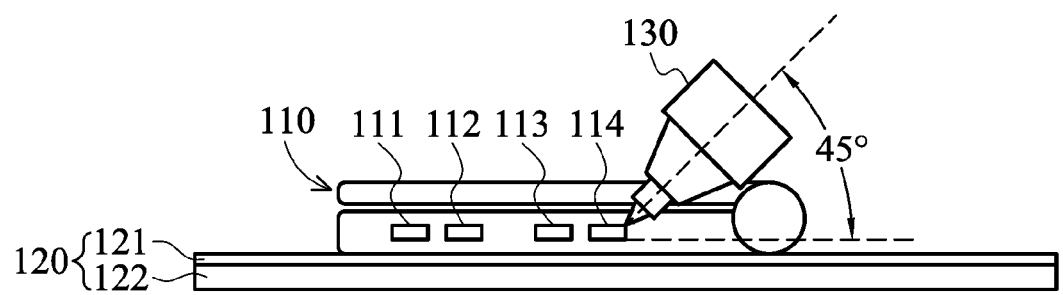
FIG. 2B is a schematic diagram of an exemplary embodiment of a test system operated in a second operation mode.

FIG. 2A is a schematic diagram of an exemplary embodiment of a specific action. FIG. 2B is a schematic diagram of an exemplary embodiment of the test system in a second operation mode. A second discharge voltage is provided to the external metal portion (step S201). The invention does not limit the relationship between the first and the second discharge voltages. In one embodiment, the second discharge voltage is the same or different from the first discharge voltage.

Refer to FIG. 2B, in the second operation mode, the object 110 is moved to be disposed on the horizontal plane 120. In this embodiment, when an ESD gun 130 contacts the external metal portion 114, an angle between the ESD gun 130 and the external metal portion 114 is 45°, but the disclosure is not limited thereto. In other embodiments, the angle between the ESD gun 130 and the external metal portion 114 may be less than 45°. In this embodiment, the angle between the ESD gun 130 and the external metal portion 114 is about 15°.

After the second discharge voltage is provided thereto, it is determined whether a second error has occurred during the operation of the object (step S202). When the second error has not occurred during the operation of the object, the EST test is end (step S204). Alternatively, when the second error has occurred during the operation of the object, a debugging procedure is executed to eliminate the second error (step S203).

Figure 3A:
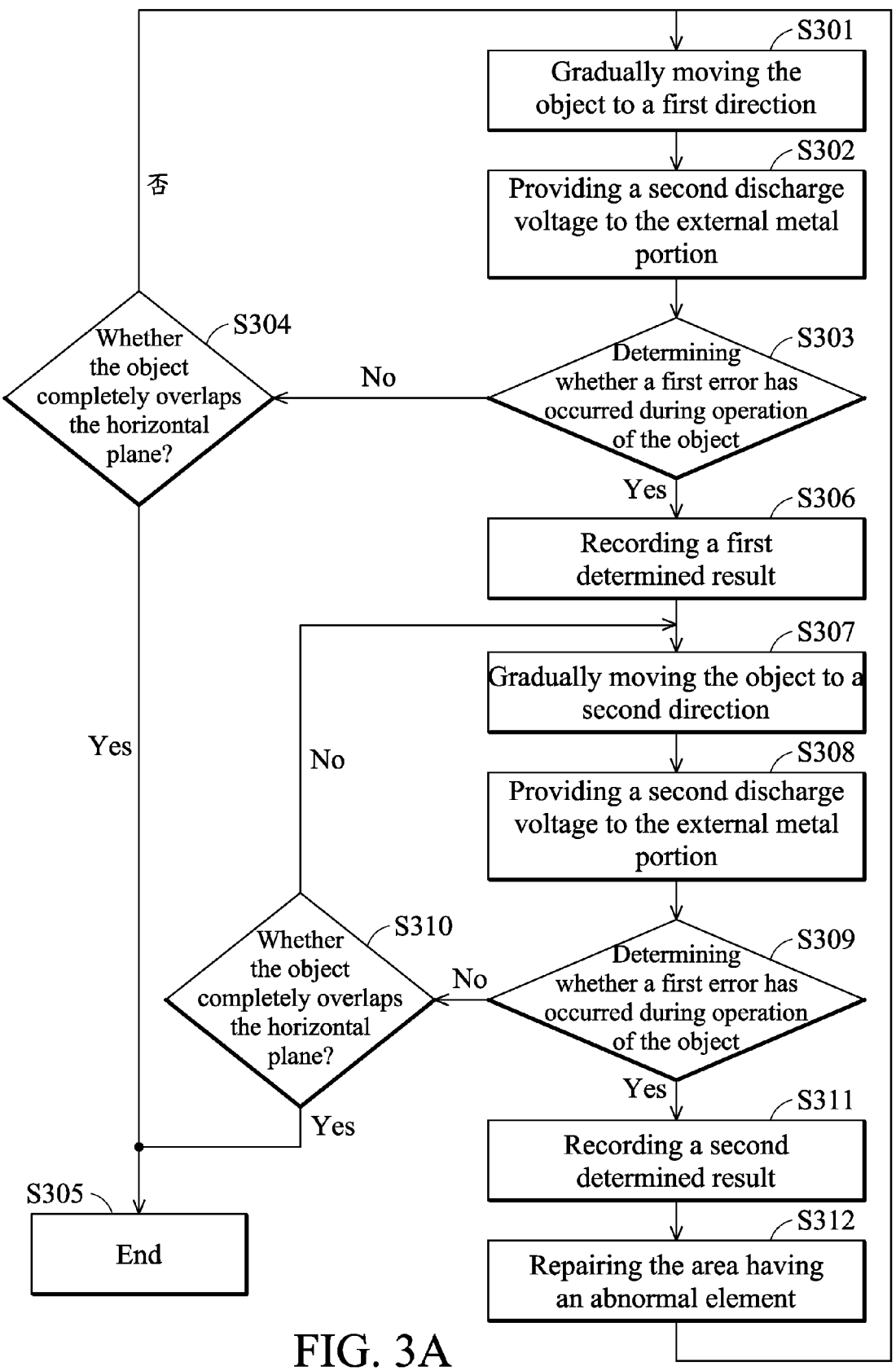
FIG. 3A is a schematic diagram of an exemplary embodiment of a debugging procedure.
Figure 3B:
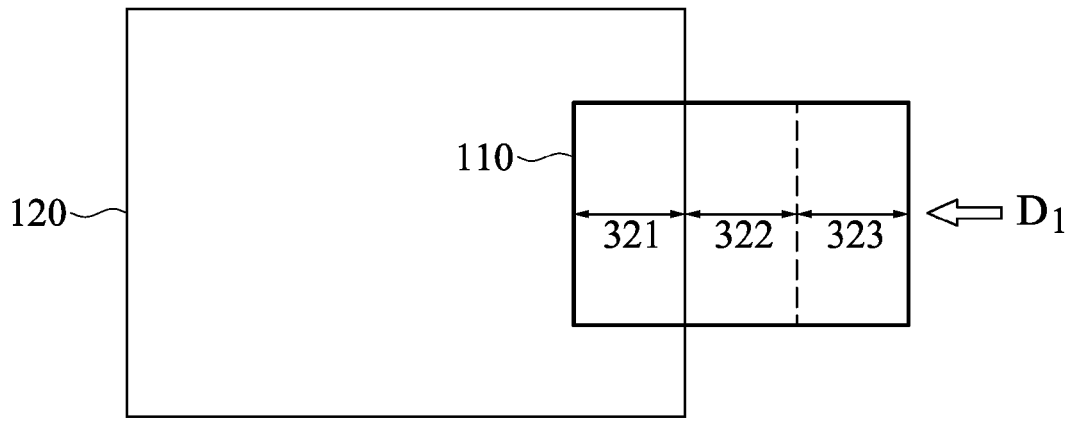
FIGS. 3B~3D, 4A~4C and 5A~5C are schematic diagrams of other exemplary embodiments of the movement of the object.
Figure 3C:
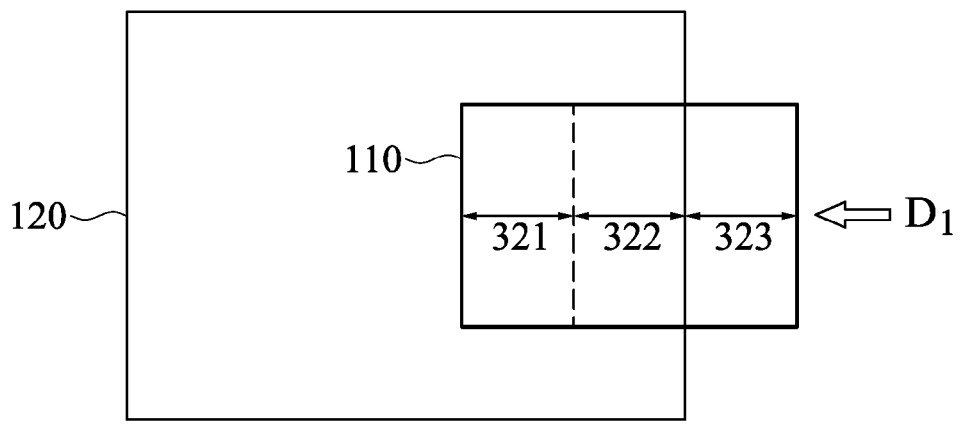
Figure 3D:
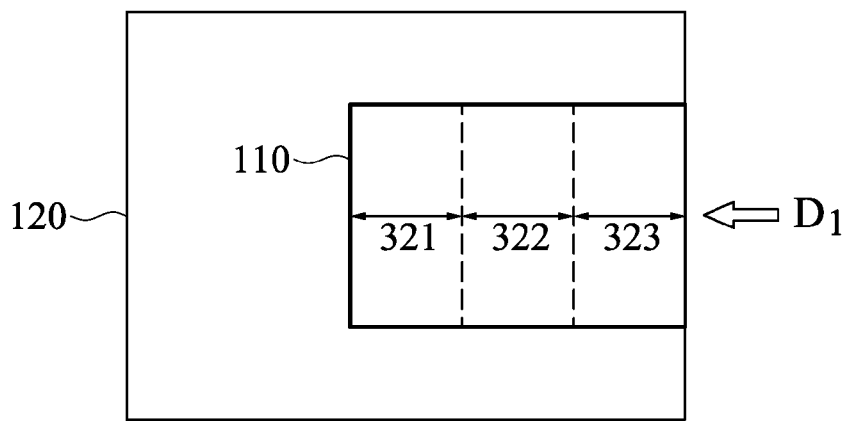

FIG. 3A is a schematic diagram of an exemplary embodiment of a debugging procedure. After disposing the object on the horizontal plane, the object is moved gradually to a first direction to adjust a size of an overlap area between the object and the horizontal plane (step S301). Refer to FIGS. 3B-3D, in this embodiment, when the object operates in the second operation mode, the size of the overlap area between the object 110 and the horizontal plane 120 is gradually increased. In one embodiment, a carrier (not shown) is utilized to move the object 110.

The invention does not limit the lengths of the moved distances for each time. In one embodiment, the lengths of the moved distances are the same. Additionally, the invention does not limit the times of moving the object. In this embodiment, the object 110 completely overlaps the horizontal plane 120 when the object 110 is moved for three times.

Each time the object is moved, the second discharge voltage is provided to the external metal portion (step S302) and then it is determined whether the second error has occurred during the operation of the object (step S303). When no error occurs during the operation of the object, whether the object completely overlaps the horizontal plane is determined (step S304). If the object does not completely overlap the horizontal plane, the object is moved again (step S301) until the object completely overlaps the horizontal plane.

Refer to FIG. 3B, the object 110 is moved to the direction $D_1$. In this embodiment, after moving the object 110, only a region 321 overlaps the horizontal plane 120. At this time, the second discharge voltage is provided to the external metal portion of the object 110. It is determined whether an error has occurred during the operation of the object 110.

When no error occurs during the operation of the object 110, a carrier moves the object 110 to the direction $D_1$. Refer to FIG. 3C, after a second moving operation, the regions 321 and 322 overlap the horizontal plane 120. At this time, the second discharge voltage is provided to the external metal portion of the object 110 again. Then, it is again determined whether an error has occurred during the operation of the object 110.

When no error occurs during the operation of the object 110, the carrier moves the object 110 to the direction $D_1$. Refer to FIG. 3D, after a third moving operation, the regions 321~323 overlap the horizontal plane 120. In other words, the object 110 completely overlaps the horizontal plane 120. At this time, the second discharge voltage is provided to the external metal portion of the object 110 again. Then, it is again determined whether an error has occurred for the object during the operation of the object 110.

When no error occurs during the operation of the object 110, since the object 110 completely overlaps the horizontal plane 120, the ESD test ends (step S305). Alternatively, each time after the second discharge voltage is provided thereto, if an error occurs during the operation of the object, the carrier generates and records a first determined result according to the size of the overlap area between the object and the horizontal plane (step S306). In other words, the carrier records which region overlaps the horizontal plane to induce the error during the operation of the object. In one embodiment, steps S303~306 are achieved by a carrier or other test apparatuses.

Figure 4A:
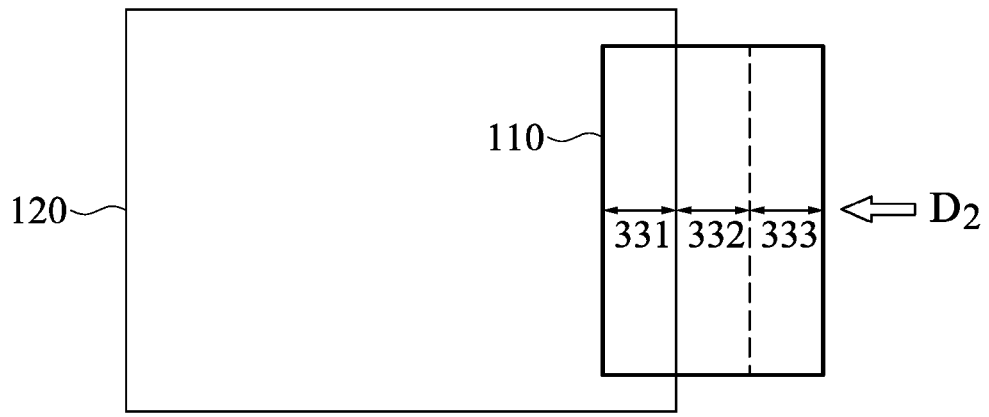
Figure 4B:
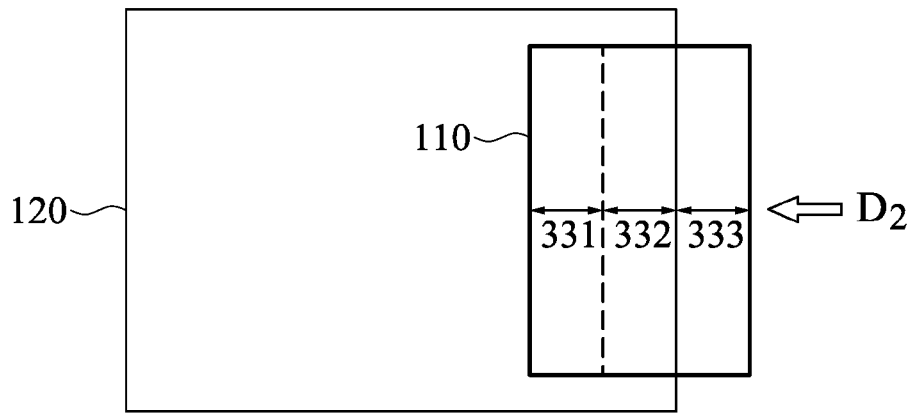
Figure 4C:
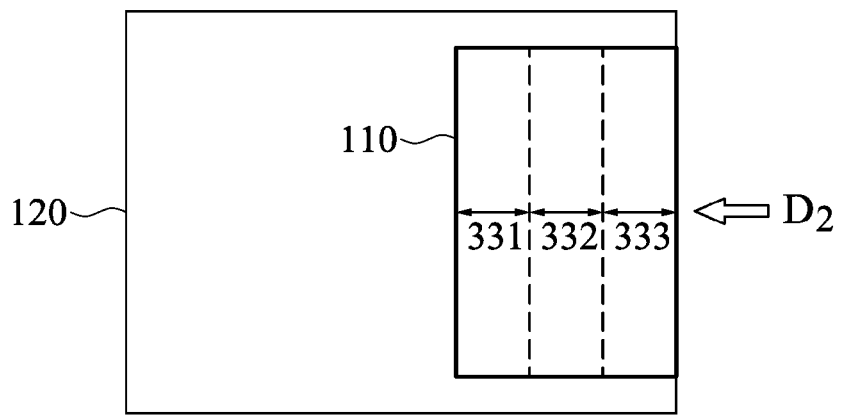

Then, the object is gradually moved to a second direction (step S307). The invention does not limit the relationship between the first and the second directions. Refer to FIGS. 4A~4C, FIGS. 4A~4C show exemplary embodiments of the movement of the object. In this embodiment, the second direction $D_2$ is the same as the first direction $D_1$. The object 110 is moved horizontally. In another embodiment, a carrier rotates the object 110 with 90° and then moves the object 110 to the direction $D_2$.

Each time when the object is moved to the second direction, the second discharge voltage is provided to the external metal portion of the object (step S308) and then it is determined whether an error has occurred during the operation of the object (step S309). When no error occurs during the operation of the object, it is determined whether the object completely overlaps the horizontal plane (step S310). When the object does not completely overlap the horizontal plane, step S307 is executed to move the object until the object completely overlaps the horizontal plane.

Refer to FIG. 4A, the object 110 is moved to the direction $D_2$. In this embodiment, after moving the object, only a region 331 overlaps the horizontal plane 120. At this time, the second discharge voltage is provided to the external metal portion of the object 110 and it is determined whether an error has occurred for the object during the operation of the object 110.

If no error occurs during the operation of the object 110, the object 110 is moved to the direction $D_2$. Refer to FIG. 4B, the regions 331 and 332 overlap the horizontal plane 120. At this time, the second discharge voltage is provided to the external metal portion again and then it is again determined whether an error has occurred during the operation of the object 110.

If no error occurs during the operation of the object 110, the object 110 is moved to the direction $D_2$. Refer to FIG. 4C, the regions 331~333 overlap the horizontal plane 120. In other words, the object 110 completely overlaps the horizontal plane 120. At this time, the second discharge voltage is provided to the external metal portion again and then it is again determined whether an error has occurred for the object during the operation of the object 110.

If no error occurs during the operation of the object 110, since the horizontal plane 120 is completely overlapped by the object 110, the ESD test ends (step S305). However, when the object 110 is moved to the direction $D_2$, if an error occurs during the operation of the object 110, a second determined result is generated and recorded according to the size of the overlap area between the object 110 and the horizontal plane 120 (step S311). Then, an area of the object is obtained according to the first and the second determined results, wherein the area comprises an abnormal element inducing the error and then the area is repaired (step S312).

The invention does not limit how the area is repaired. In one embodiment, an ESD protection element is disposed in the area. The ESD protection element may be a TVS, Varistor or capacitor. After the repairing step, step S301 is executed to move the object until no error occurs during the operation of the object.

In this embodiment, an x-axis position of the area is obtained according to the first determined result recorded by step S306, and then a y-axis position of the area is obtained according to the second determined result recorded by step S311. The accurate position of the area can be obtained according to the first and the second determined results. The position of the area is a root cause inducing the error and then the area is repaired to eliminate the error.

Assuming when the object 110 is moved to the direction $D_1$, the object 110 completely overlaps the horizontal plane 120 for m times, when the object 110 is moved to the direction $D_2$, the object 110 completely overlaps the horizontal plane 120 for n times. The invention does not limit the relationship between the n times and the m times. In one embodiment, n and m are any positive integer, wherein n may be equal to, higher or less than m. In other embodiments, a carrier is utilized to move the object 110.

In the above embodiments, the first and the second discharge voltages are provided to the same external metal portion until no error occurs during the operation of the object and then the first and the second discharge voltages are provided to another external metal portion.

Figure 5A:
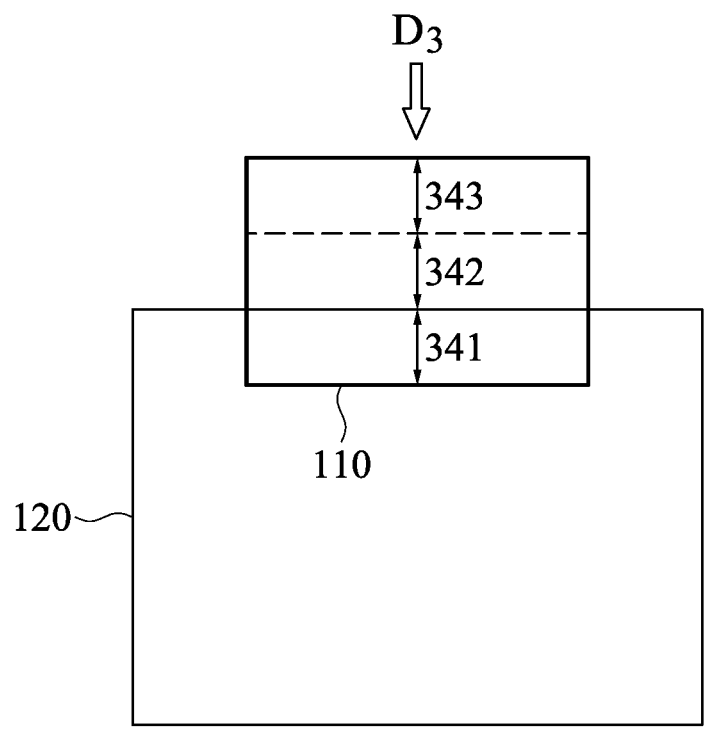
Figure 5B:
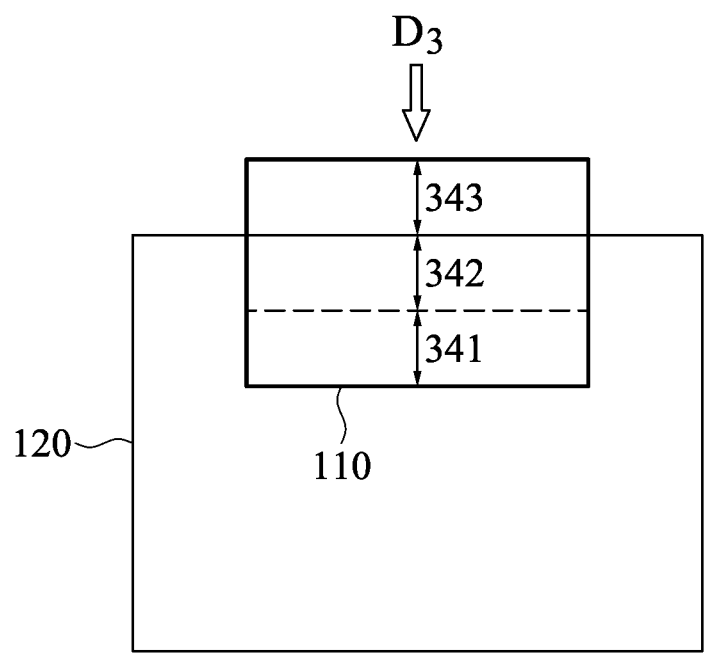
Figure 5C:
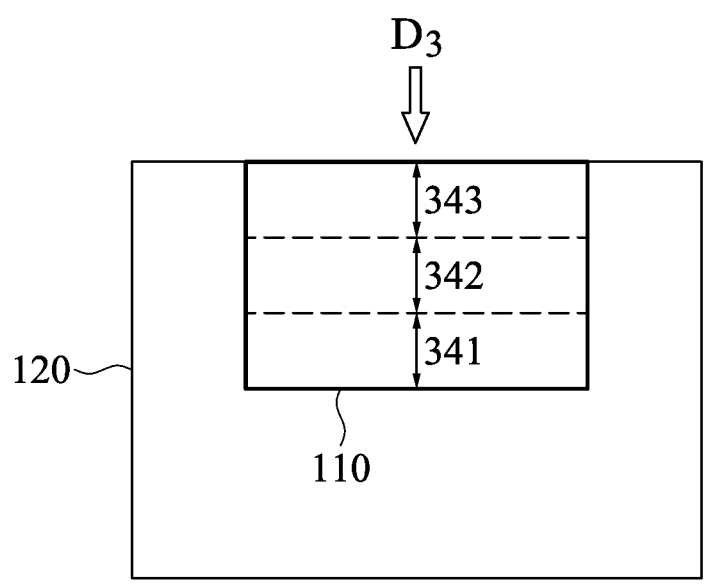

FIGS. 5A-5C are schematic diagrams of another exemplary embodiment of the movement of the object. In this embodiment, the direction $D_3$ is vertical to the direction $D_1$. Refer to FIGS. 3B~3D, when the object 110 is moved to the direction $D_1$, if an error occurs during the operation of the object 110, a first determined result is generated according to the size of an overlap area between the object 110 and the horizontal plane 120. Then, the object 110 is moved to the direction $D_3$. In this embodiment, the object 110 is not required to be rotated. The object 110 is moved from another side of the horizontal plane 120. In FIGS. 3B~3D, the object 110 is horizontally moved. In FIGS. 5A~5C, the object 110 is vertically moved.

The invention does not limit the movement direction of the object 110 and the movement relationship between the object 110 and the horizontal plane 120. Any movement method can be utilized, as long as the method is capable of gradually increasing the size of the overlap area between the object 110 and the horizontal plane 120. Additionally, the invention does not limit the size of the increased overlap areas for each time. In one embodiment, the sizes of the increased overlap areas are the same.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An electrostatic discharge (ESD) test method, comprising:
    activating an object to be tested and controlling the object to separate from a horizontal plane by a pre-determined distance;
    providing a first discharge voltage to an external metal portion of the object;
    determining whether a first error has occurred during operation of the object each time after the first discharge voltage is provided to the external metal portion;
    processing the object to eliminate the first error and then providing the first discharge voltage to the external metal portion when the first error occurs during the operation of the object, wherein the first error is induced by a hardware structure of the object; and
    moving the object to contact with the horizontal plane and executing a specific action when the first error has not occurred during the operation of the object, wherein the specific action comprises:

providing a second discharge voltage to the external metal portion;

determining whether a second error has occurred during the operation of the object after the second discharge voltage is provided thereto; and executing a debugging procedure to eliminate the second error when the second error has occurred during the operation of the object, wherein the debugging procedure comprises:

gradually moving the object to a first direction to adjust a size of an overlap area between the object and the horizontal plane;

providing the second discharge voltage to the external metal portion and determining whether the second error has occurred during the operation of the object each time the object is moved to the first direction;

moving the object to the first direction again and until the object completely overlaps the horizontal plane when the second error has not occurred during the operation of the object;

generating a first determined result according to the size of the overlap area between the object and the horizontal plane when the second error has occurred during the operation of the object;

recording the first determined result;

gradually moving the object to a second direction to adjust the size of the overlap area;

providing the second discharge voltage to the external metal portion and determining whether the second error has occurred during the operation of the object each time the object is moved to the second direction;

moving the object to the second direction again and until the object completely overlaps the horizontal plane when the second error has not occurred during the operation of the object;

generating a second determined result according to the size of the overlap area between the object and the horizontal plane when the second error has occurred during the operation of the object;

recording the second determined result; and obtaining an area of the object according to the first and the second determined results, wherein the area comprises an abnormal element inducing the second error.

2. The ESD test method as claimed in claim 1, wherein a length of the pre-determined distance is determined according to the first discharge voltage.

3. The ESD test method as claimed in claim 2, wherein the length of the pre-determined distance is 50 cm.

4. The ESD test method as claimed in claim 1, wherein the external metal portion is an input output port or an ornament.

5. The ESD test method as claimed in claim 1, wherein the horizontal plane comprises a metal layer and an isolation layer disposed between the metal layer and the object.

6. The ESD test method as claimed in claim 1, wherein the first direction is vertical to the second direction.

7. The ESD test method as claimed in claim 1, wherein the step of providing the second discharge voltage to the external metal portion comprises:

utilizing an ESD gun to generate the second discharge voltage.

8. The ESD test method as claimed in claim 7, wherein an angle between the ESD gun and the external metal portion is less than 45°.

9. The ESD test method as claimed in claim 1, wherein the moved distances of the object are the same.

10. A test system comprising:

a horizontal plane;

an object comprising at least one external metal portion, wherein the object is to be tested;

a carrier moving the object; and an ESD gun generating a first discharge voltage;

wherein in a first operation mode, the object is separated from the horizontal plane by a pre-determined distance, and the external metal portion receives the first discharge voltage, and when a first error has not occurred during operation of the object, a second operation mode is activated, wherein in the second operation mode, the carrier moves the object to contact with the horizontal plane, wherein in the second operation mode, the ESD gun provides a second discharge voltage to the external metal portion and the carrier gradually moves the object to a first direction to adjust a size of an overlap area between the object and the horizontal plane, wherein each time the object is moved to the first direction, the ESD gun provides the second discharge voltage to the external metal portion, and when the first error has not occurred during the operation of the object, the carrier again moves the object until the object completely overlaps the horizontal plane, and when a first error occurs during the operation of the object, the carrier generates and records a first determined result according to the size of the overlap area between the object and the horizontal plane, wherein after recording the first determined result, the carrier gradually moves the object to a second direction, and each time the object is moved to the second direction, the ESD gun provides the second discharge voltage to the external metal portion, wherein when the second error has not occurred during the operation of the object, the carrier again moves the object until the object completely overlaps the horizontal plane, and when the second error occurs during the operation of the object, the carrier generates and records a second determined result according to the size of the overlap area between the object and the horizontal plane, and wherein the carrier obtains an area of the object according to the first and the second determined results, and the area comprises an abnormal element inducing the second error.

11. The test system as claimed in claim 10, wherein a length of the pre-determined distance relates to the first discharge voltage.

12. The test system as claimed in claim 11, wherein the length of the pre-determined distance is 50 cm.

13. The test system as claimed in claim 10, wherein the external metal portion is an input output port or an ornament.

14. The test system as claimed in claim 10, wherein the horizontal plane comprises a metal layer and an isolation layer disposed between the metal layer and the object.

15. The test system as claimed in claim 10, wherein the first direction is vertical to the second direction.

16. The test system as claimed in claim 10, wherein an angle between the ESD gun and the external metal portion is less than 45°.

17. The test system as claimed in claim 10, wherein the moved distances of the object are the same.

* * * * *